United States Patent
Kim et al.

(10) Patent No.: US 12,392,806 B2
(45) Date of Patent: Aug. 19, 2025

(54) ELECTRONIC DEVICE AND CONTROLLING METHOD THEREOF

(71) Applicant: SAMSUNG ELECTRONICS CO., LTD., Suwon-si (KR)

(72) Inventors: Kyusik Kim, Suwon-si (KR); Hyeongmo Gu, Suwon-si (KR); Jangwoo Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 193 days.

(21) Appl. No.: 18/089,176

(22) Filed: Dec. 27, 2022

(65) Prior Publication Data

US 2023/0135862 A1    May 4, 2023

Related U.S. Application Data

(63) Continuation of application No. PCT/KR2021/006440, filed on May 24, 2021.

(30) Foreign Application Priority Data

Jul. 20, 2020  (KR) .......................... 10-2020-0089518

(51) Int. Cl.
  *G01R 19/165*  (2006.01)
(52) U.S. Cl.
  CPC .............................. *G01R 19/16538* (2013.01)
(58) Field of Classification Search
  CPC .............. G01R 19/16538; G01R 31/54; G01R 19/16576; G01R 19/1659; G01R 19/0084;
  (Continued)

(56) References Cited

U.S. PATENT DOCUMENTS 6,671,150 B2   12/2003   Elms et al.
6,777,954 B2    8/2004   Yamada et al.
           (Continued)

FOREIGN PATENT DOCUMENTS

JP    2003-199243    7/2003
JP    2003-262381    9/2003
           (Continued)

OTHER PUBLICATIONS

International Search Report, PCT/ISA/210, dated Sep. 30, 2021, issued in PCT/KR2021/006440.

(Continued)

*Primary Examiner* — Metasebia T Retebo
(74) *Attorney, Agent, or Firm* — STAAS & HALSEY LLP

(57) ABSTRACT

Provided is an electronic device and method for controlling the same, which controls an operation by detecting a voltage between a plurality of live terminals and thus determining whether there is an error in supplying power through a power input terminal. According to an embodiment, an electronic device includes a power input terminal including a plurality of live terminals and a neutral terminal; a voltage detection circuit connected between the plurality of live terminals for detecting a voltage between the plurality of live terminals; and a controller configured to control operation of the electronic device to be interrupted in response to a magnitude of the voltage between the plurality of live terminals smaller than a threshold.

13 Claims, 10 Drawing Sheets

(58) Field of Classification Search
CPC .... G06F 1/26; G06F 3/14; G08B 3/10; G08B 21/18; G08B 21/185; H01H 47/00; H01H 47/002; H01R 4/30; H02H 3/10; H02H 3/105

See application file for complete search history.

(56) References Cited

U.S. PATENT DOCUMENTS

| | | | |
|---|---|---|---|
| 8,093,858 | B1 | 1/2012 | Kadah et al. |
| 8,341,002 | B2 | 12/2012 | Han et al. |
| 9,588,153 | B2 | 3/2017 | Jung |
| 10,003,850 | B2 | 6/2018 | Kim et al. |
| 2012/0098521 | A1 | 4/2012 | Kochorek et al. |
| 2018/0130623 | A1 | 5/2018 | Hopkins |
| 2018/0298548 | A1 | 10/2018 | Kim et al. |

FOREIGN PATENT DOCUMENTS

| | | |
|---|---|---|
| JP | 2019-154215 | 9/2019 |
| KR | 1996-0010665 | 8/1996 |
| KR | 10-0202080 | 6/1999 |
| KR | 10-0259517 | 6/2000 |
| KR | 10-0348249 | 8/2002 |
| KR | 10-0912645 | 8/2009 |
| KR | 10-2010-0018834 | 2/2010 |
| KR | 20100018834 A * | 2/2010 |
| KR | 10-2011-0013583 | 2/2011 |
| KR | 10-1028786 | 4/2011 |
| KR | 10-1257094 | 4/2013 |
| KR | 10-2015-0072651 | 6/2015 |
| KR | 10-1780653 | 9/2017 |
| KR | 10-1891117 | 8/2018 |
| KR | 10-1957168 | 3/2019 |
| KR | 10-2020-0034303 | 3/2020 |

OTHER PUBLICATIONS

Written Opinion, PCT/ISA/237, dated Sep. 30, 2021, issued in PCT/KR2021/006440.
Korean Office Action dated Mar. 23, 2025 for Korean Application No. 10-2020-0089518.

\* cited by examiner

ELECTRONIC DEVICE AND CONTROLLING METHOD THEREOF

CROSS-REFERENCE TO RELATED APPLICATIONS

This application is a continuation of International Application PCT/KR2021/006440, filed May 24, 2021, and claims foreign priority to Korean application 10-2020-0089518, filed Jul. 20, 2020, which are both incorporated herein by reference in their entireties.

BACKGROUND

1. Field

The disclosure relates to an electronic device having a plurality of live terminals and a neutral terminal as a power input terminal and method for controlling the electronic device.

2. Description of Related Art

In a case of electronic devices having 3-wired or 4-wired power specifications, power may be supplied by connecting the power wires to terminals of a product. The electronic device includes an electric component (e.g., a motor, a lamp, or a pump) having a rated voltage of 120 V and an electric component (e.g., a heater) having a rated voltage of 240 V, and when the power wire is wrongly connected to the terminal, 240 V may be applied to the electric component having the rated voltage of 120 V, causing damage by fire and ignition or causing malfunction as the rated voltage of 240 V is not applied to the corresponding electric component.

An overvoltage detection circuit is added to the traditional electronic device to prevent damage by fire of an electric component when an overvoltage is applied in relation to a power specification of the electric component. The overvoltage detection circuit may detect an overvoltage caused by wrong connection of the power wire, but has a limitation in that no connection of the power wire or no application of power from an outlet may not be detected.

SUMMARY

According to an embodiment of the disclosure, an electronic device includes a power input terminal including a first live terminal, a second live terminal, and a neutral terminal; a voltage detection circuit connected between the first live terminal and the second live terminal to detect a voltage between the first live terminal and the second live terminal; and a controller configured to control operation of the electronic device to be interrupted in response to a magnitude of the detected voltage being smaller than a threshold.

According to an embodiment of the disclosure, the voltage detection circuit is configured to output a square wave by half-rectifying the detected voltage in response to the magnitude of the detected voltage being equal to or greater than the threshold.

According to an embodiment of the disclosure, wherein the controller is configured to control the electronic device to be operated in response to the voltage detection circuit outputting the square wave.

According to an embodiment of the disclosure, the controller is configured to control operation of the electronic device to be interrupted in response to the voltage detection circuit outputting no square wave.

According to an embodiment of the disclosure, the electronic device further includes a first electric component connected between the first live terminal and the second live terminal; a second electric component connected between the first live terminal and the neutral terminal; a first relay connected in series with the first electric component; and a second relay connected in series with the second electric component, wherein the controller is configured to control the first relay and the second relay to be turned off in response to the magnitude of the detected voltage being smaller than the threshold.

According to an embodiment of the disclosure, the threshold is determined as a value between an error range of the voltage between the first live terminal and the second live terminal in normal connection of power wires and an error range of a voltage between the first live terminal and the neutral terminal in normal connection of the power wires.

According to an embodiment of the disclosure, the electronic device further includes a display, wherein the controller is configured to control the display to display a message indicating that there is an error in supplying power through the power input terminal in response to the magnitude of the detected voltage being smaller than the threshold.

According to an embodiment of the disclosure, the electronic device further includes a speaker, wherein the controller is configured to control the speaker to output a sound of notification indicating that there is an error in supplying power through the power input terminal in response to the magnitude of the detected voltage being smaller than the threshold.

According to an embodiment of the disclosure, a method is provided of controlling an electronic device including a power input terminal having a first live terminal, a second live terminal, and a neutral terminal, the method includes detecting a voltage between the first live terminal and the second live terminal by a voltage detecting circuit connected between the first live terminal and the second live terminal; comparing a magnitude of the detected voltage with a threshold; and controlling operation of the electronic device to be interrupted in response to the magnitude of the detected voltage being smaller than the threshold.

According to an embodiment of the disclosure, the voltage detection circuit is configured to output a square wave by half-rectifying the detected voltage in response to the magnitude of the detected voltage being equal to or greater than the threshold.

According to an embodiment of the disclosure, the method further includes controlling the electronic device to be operated in response to the voltage detection circuit outputting the square wave.

According to an embodiment of the disclosure, the controlling of the operation of the electronic device to be interrupted includes controlling the operation of the electronic device to be interrupted in response to the voltage detection circuit outputting no square wave.

According to an embodiment of the disclosure, the electronic device includes a first electric component connected between the first live terminal and the second live terminal; a second electric component connected between the first live terminal and the neutral terminal; a first relay connected in series with the first electric component; and a second relay connected in series with the second electric component, wherein the controlling of the operation of the electronic device to be interrupted includes controlling the first relay and the second relay to be turned off in response to the magnitude of the detected voltage being smaller than the threshold.

According to an embodiment of the disclosure, the threshold is determined as a value between an error range of the voltage between the first live terminal and the second live terminal in normal connection of power wires and an error range of a voltage between the first live terminal and the neutral terminal in normal connection of the power wires.

According to an embodiment of the disclosure, the electronic device includes a display, and the method further includes controlling the display to display a message indicating that there is an error in supplying power through the power input terminal in response to the magnitude of the detected voltage being smaller than the threshold.

Additional aspects will be set forth in part in the description which follows and, in part, will be apparent from the description, or may be learned by practice of the presented embodiments.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1:
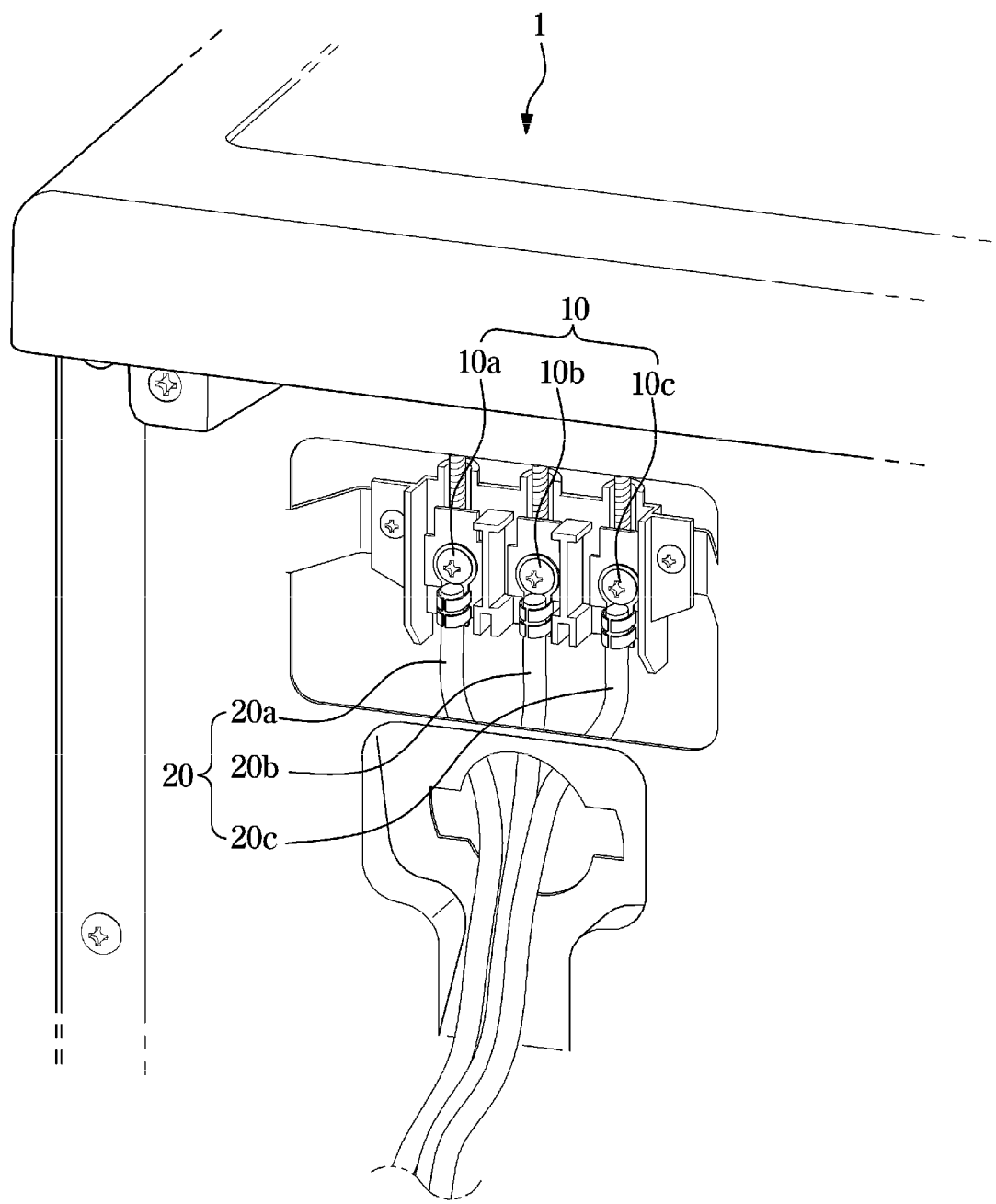
FIG. 1 illustrates a power input terminal equipped in an electronic device, according to an embodiment.

Embodiments and features as described and illustrated in the disclosure are merely examples, and there may be various modifications replacing the embodiments and drawings at the time of filing this application.

It will be further understood that the term "connect" or its derivatives refer both to direct and indirect connection, and the indirect connection includes a connection over a wireless communication network.

The terminology used herein is for the purpose of describing particular embodiments only and is not intended to limit the disclosure. It is to be understood that the singular forms "a," "an," and "the" include plural references unless the context clearly dictates otherwise. It will be further understood that the terms "comprise" and/or "comprising," when used in this specification, specify the presence of stated features, integers, steps, operations, elements, and/or components, but do not preclude the presence or addition of one or more other features, integers, steps, operations, elements, components, and/or groups thereof.

The terms including ordinal numbers like "first" and "second" may be used to explain various components, but the components are not limited by the terms. The terms are only for the purpose of distinguishing a component from another. Thus, a first element, component, region, layer or room discussed below could be termed a second element, component, region, layer or section without departing from the teachings of the disclosure.

Furthermore, the terms, such as "— part", "— block", "— member", "— module", etc., may refer to a unit of handling at least one function or operation. For example, the terms may refer to at least one process handled by hardware such as field-programmable gate array (FPGA)/application specific integrated circuit (ASIC), etc., software stored in a memory, or at least one processor.

Reference numerals used for method steps are just used to identify the respective steps, but not to limit an order of the steps. Thus, unless the context clearly dictates otherwise, the written order may also be practiced otherwise.

According to various embodiments of the disclosure, provided is an electronic device and method for controlling the same, which controls an operation by detecting a voltage between a plurality of live terminals and thus determining whether there is an error in supplying power through a power input terminal.

According to various embodiments of the disclosure, an electronic device and method for controlling the same may prevent damage by fire and ignition of an electric component or malfunction of an electric component by detecting a voltage between a plurality of live terminals and determining whether there is an error in supplying power through a power input terminal.

Reference will now be made in detail to embodiments of the disclosure, which are illustrated in the accompanying drawings.

Figure 2:
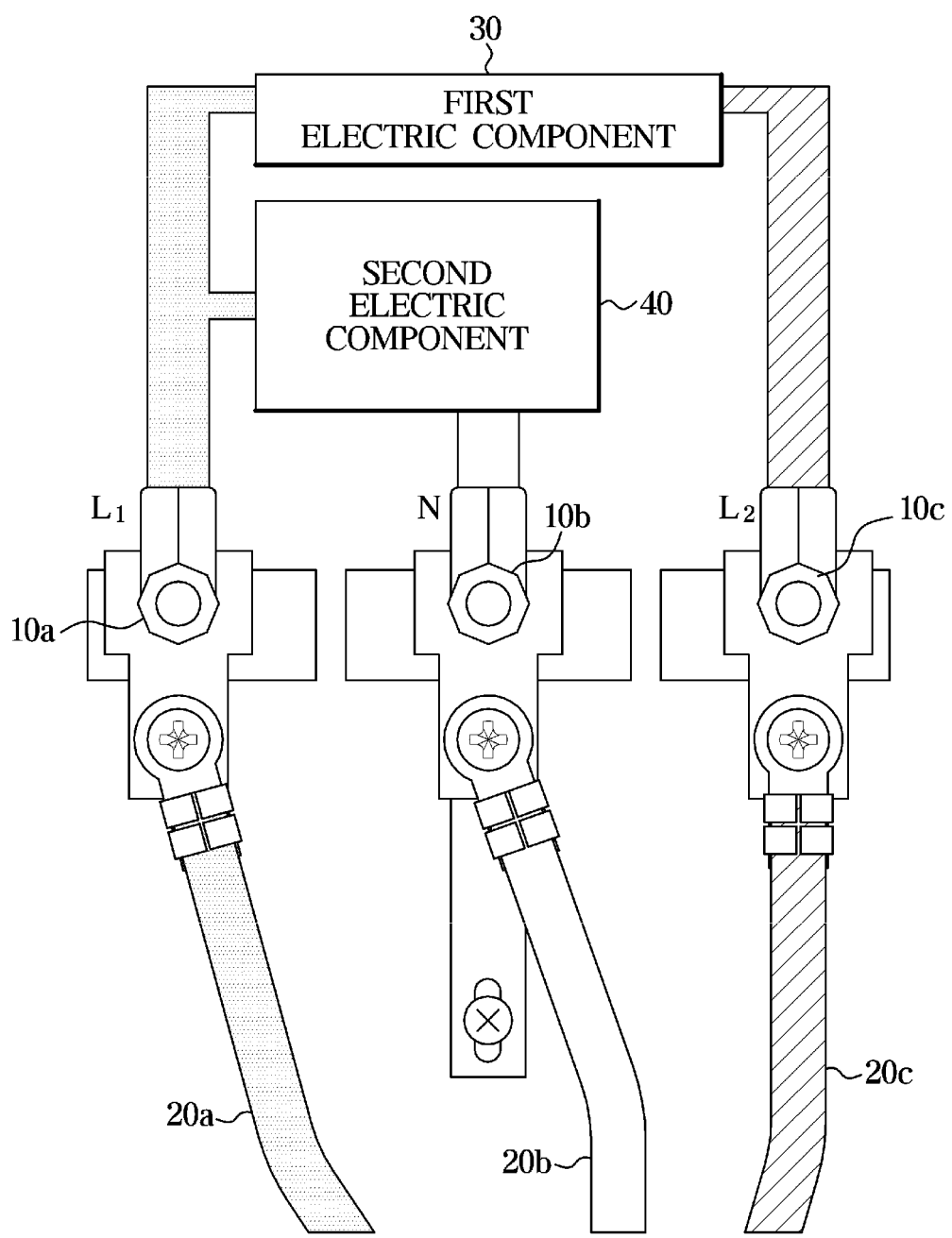
FIG. 2 is a diagram for describing a connection relation between an electric component and a power input terminal in an electronic device, according to an embodiment.

FIG. 1 illustrates a power input terminal equipped in an electronic device, according to an embodiment. FIG. 2 is a diagram for describing a connection relation between an electric component and a power input terminal in an electronic device, according to an embodiment.

Referring to FIGS. 1 and 2, an electronic device 1 according to an embodiment may include a power input terminal 10 connected to a power wire 20. The electronic device 1 may receive power from an external power source (not shown) through the power input terminal 10 connected to the power wire 20. In other words, the power wire 20 may connect an outlet (not shown) to the power input terminal 10.

The power input terminal 10 may be arranged in a housing of the electronic device 1, and may include a plurality of live terminals 10a and 10c and a neutral terminal 10b. Specifically, the power input terminal 10 may include the first live terminal (L1 terminal) 10a, the neutral terminal (N terminal) 10b and the second live terminal (L2 terminal) 10c.

In general, power wires 20a and 20c for inputting a voltage of 120 V may be connected to the plurality of live terminals 10a and 10c, and a neutral line 20b may be connected to the neutral terminal 10b. In this case, the voltage input from the first power wire 20a connected to the first live terminal 10a is 180 degrees out of phase with a voltage input from the second power wire 20c connected to the second live terminal 10b. With this, an alternate current (AC) voltage of 120 V may be applied between the live terminals 10a and 10c and the neutral terminal 10b, and an AC voltage of 240 V may be applied between the plurality of live terminals 10a and 10c.

In this case, a first electric component 30 of the electronic device 1 may be arranged between the first live terminal 10a and the second live terminal 10c and receive a voltage between the first live terminal 10a and the second live terminal 10c, and a second electric component 40 may receive a voltage between the first live terminal 10a and the neutral terminal 10b.

That is, a rated voltage of the first component 30 may be 240 V, and a raged voltage of the second component 40 may be 120 V. Hence, the power wires 20a and 20c for inputting an AC voltage of 120 V may be connected to the first live terminal 10a and the second live terminal 10c, and the neutral line 20b may be connected to the neutral terminal 10b, so that the rated voltages may be applied to the first electric component 30 and the second electric component 40, respectively.

For example, the electronic device 1 may be a dryer with the first electric component 30 being a heater having a rated voltage of 240 V and the second electric component 40 being a motor, a lamp, a pump, or the like having the rated voltage of 120 V.

For example, the electronic device 1 may be a cooking device with the first electric component 30 being a heater having a rated voltage of 240 V and the second electric component 40 being a motor, a lamp, or the like having the rated voltage of 120 V.

The electronic device 1 is not limited to having the above types, and the electronic device 1 may be any type of electronic device that includes an electric component having a rated voltage of 240 V and an electric component having a rated voltage of 120 V and receives power through live terminals and a neutral terminal without limitations.

In this case, when the power input terminal 10 and the power wire 20 are connected without any errors, a rated voltage may be applied to each of the first electric component 30 and the second electric component 40.

When the power input terminal 10 and the power wire 20 are wrongly connected, a wrong rated voltage or no voltage may be applied to each of the first electric component 30 and the second electric component 40.

Specifically, when the neutral line 20b is connected to other terminal than the neutral terminal 10b, at least one of the first electric component 30 and the second electric component 40 fails to receive the rated voltage and may thus be damaged by fire or may have a degraded output.

For example, when the second live terminal 10c is not connected to the second power wire 20c (no connection) or when the second live terminal 10c is connected to the neutral line 20b instead of the second power wire 20c (wrong connection), the output of the first electric component 30 may be degraded because no rated voltage is applied to the first electric component 30 and an error in function (e.g., drying course) of the first electric component 30 may occur.

Furthermore, even when the second live terminal 10c is connected to the second power wire 20c, but when a voltage of 240 V is not applied because the interior wiring in the place where the electronic device 1 is installed has a two-wire type, no voltage is applied to the first electric component 30 so that the first electric component 30 is not operated and an error in function (e.g., a drying course) of the first electric component 30 may occur.

Accordingly, in an embodiment, the electronic device 1 detects a voltage between the plurality of live terminals 10a and 10c and determines an error in supplying power through the power input terminal 10, thereby preventing damage by fire and ignition of the electric components 30 and 40 and malfunction of the electric components 30 and 40. How to determine an error in supplying power through the power input terminal 10 will now be described in detail.

Figure 3:
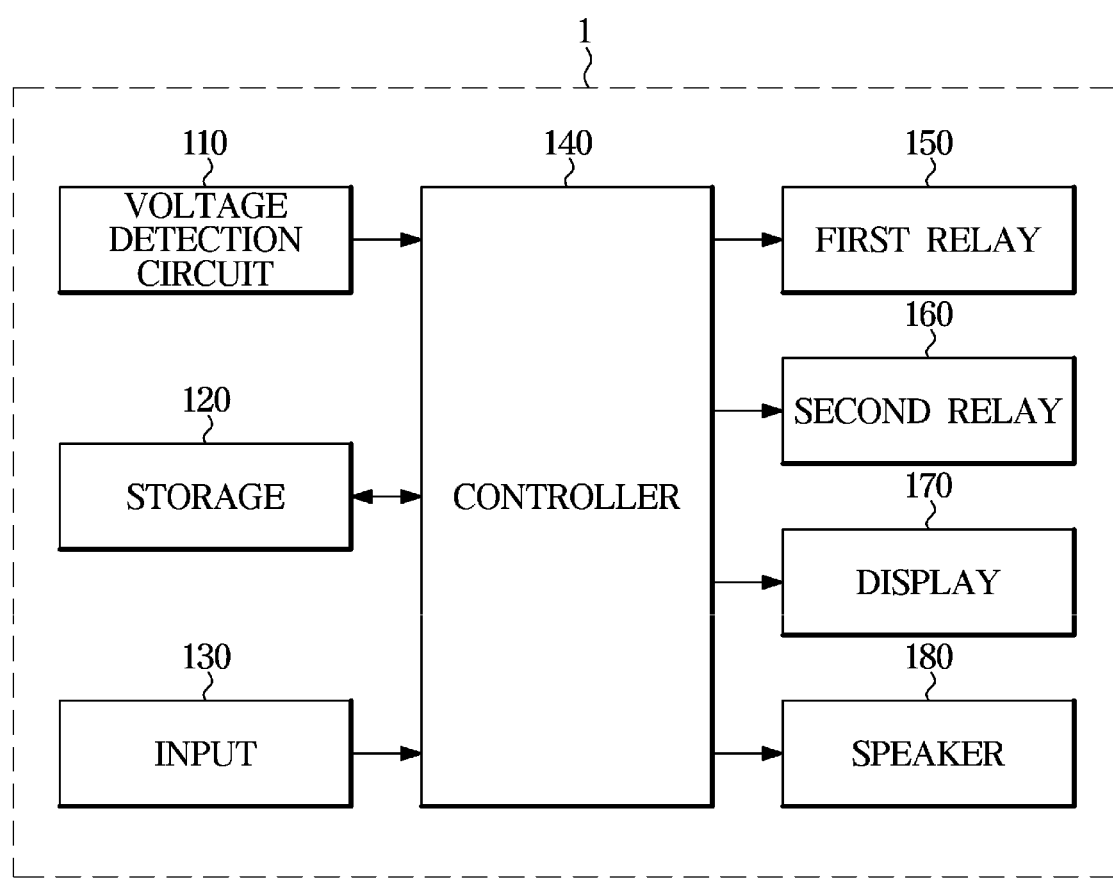
FIG. 3 is a control block diagram of an electronic device, according to an embodiment.
Figure 4:
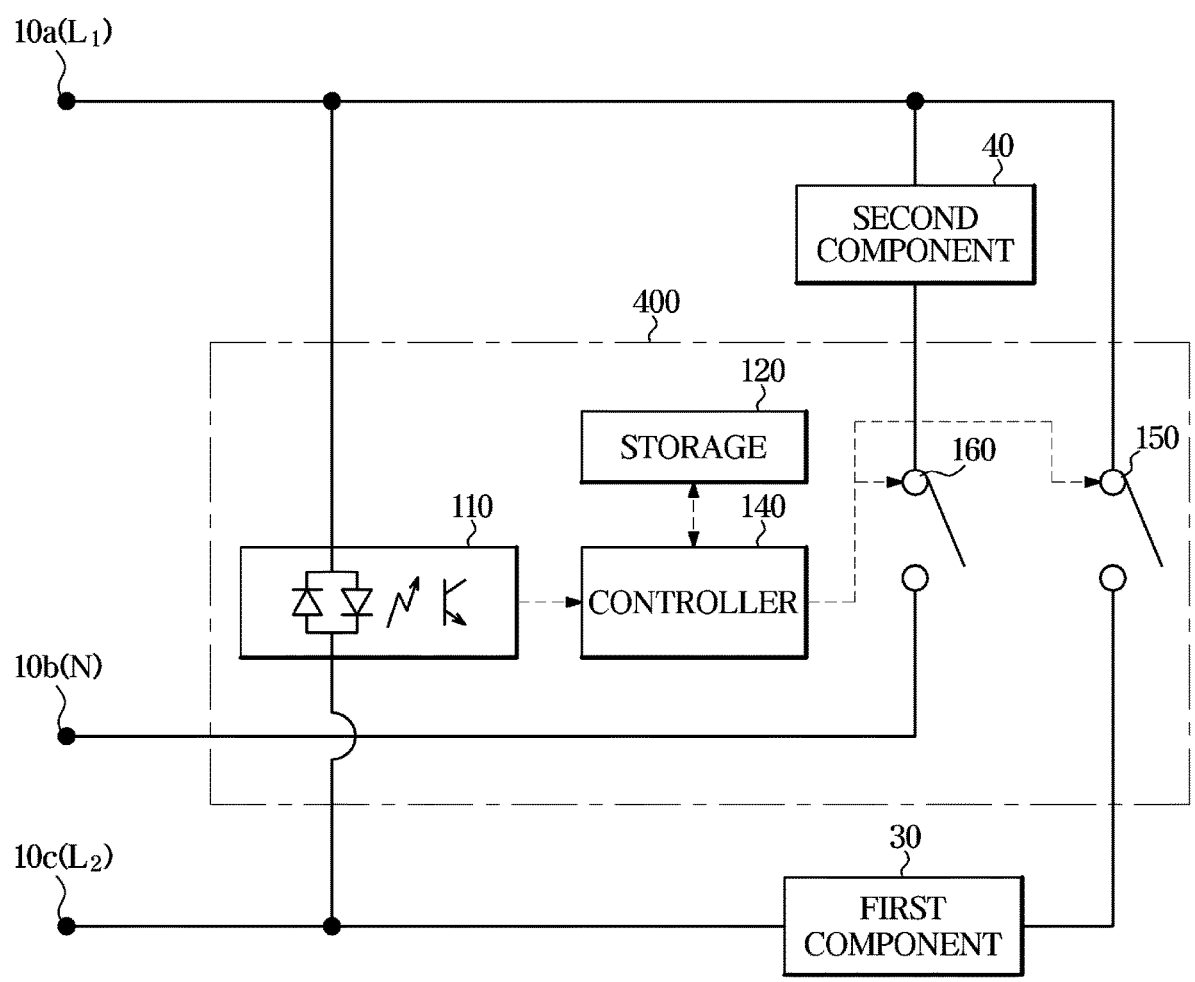
FIG. 4 is a circuit diagram of an electronic device, according to an embodiment.

FIG. 3 is a control block diagram of the electronic device 1, according to an embodiment, and FIG. 4 is a circuit diagram of the electronic device 1, according to an embodiment.

Referring to FIGS. 3 and 4, in an embodiment, the electronic device 1 includes a voltage detection circuit 110 for detecting a voltage between the plurality of live terminals 10a and 10c, a storage 120 for storing various information required for control, an input 130 for receiving an input from the user, a controller 140 for controlling an operation of the electronic device 1 by determining an error in connection of the power wire 20 based on the voltage between the plurality of live terminals 10a and 10c, a first relay 150 for controlling supplying power to the first electric component 30, a second relay 160 for controlling supplying power to the second electric component 40, a display 170 for displaying an error in supplying power, and a speaker 180 for outputting a sound of notification corresponding to the error in supplying power.

At least one component may be added to or omitted from the electronic device 1 to correspond to the performance of the electronic device 130 as shown in FIG. 3. Furthermore, it will be obvious to those of ordinary skill in the art that the relative positions of the components may be changed to correspond to the system performance or structure.

In an embodiment, the voltage detection circuit 110 is a circuit for detecting a voltage between the plurality of live terminals 10a and 10c. For this, the voltage detection circuit 110 may be connected to the first live terminal 10a and the second live terminal 10c.

Specifically, the voltage detection circuit 110 may output a square wave of a voltage by half-rectifying a voltage between the first live terminal 10a and the second live terminal 10c (L1-L2 voltage). The voltage detection circuit 110 may then send the square wave of the electric signal to the controller 140 through an insulating element.

In this case, the voltage detection circuit 110 may output the square wave of the voltage when the voltage between the first live terminal 10a and the second live terminal 10c is equal to or higher than a threshold. On the other hand, the voltage detection circuit 110 may not output the square wave of the voltage when the voltage between the first live terminal 10a and the second live terminal 10c is lower than the threshold.

The threshold is to identify an occasion when the first power wire 20a and the second power wire 20c are connected to the first live terminal 10a and the second live terminal 10c, respectively, and a voltage is applied to each power wire 20a or 20c, and may be determined to be a value between an error range (e.g., ±15%) of the voltage between the first live terminal 10a and the second live terminal 10c in normal connection of the power wire 20 and an error range (e.g., ±30%) of the voltage between the first live terminal 10a and the neutral terminal 10b in normal connection of the power wire 20.

For example, the voltage detection circuit 110 may output a square wave of a voltage when the voltage between the first live terminal 10a and the second live terminal 10c corresponds to 240 V, which corresponds to a rated voltage of the first electric component 30, and may not output a square wave of a voltage when the voltage between the first live terminal 10a and the second live terminal 10c corresponds to 120 V that falls short of the rated voltage of the first electric component 30.

Configuration and operation of the voltage detection circuit 110 will be described in detail in connection with FIG. 5.

In an embodiment, the storage 120 may store various information required for control and may be implemented as a known type of storage medium.

For example, the storage 120 may store information about a correlation between an output of the voltage detection circuit 110 and operation of the relay 150 or 160, information about a correlation between an output of the voltage detection circuit 110 and operation of the display 170, information about a correlation between an output of the voltage detection circuit 110 and operation of the speaker 180, etc.

In an embodiment, the input 130 may receive a user input related to an operation of the electronic device 1 from the user, and output an electric signal (voltage or current) corresponding to the received user input to the controller 140.

The input 130 may include a plurality of buttons arranged on the housing. For example, the input 130 may include a power button to power on the electronic device 1, a mode selection button to select an operation mode, an operation start/stop button to command start and stop of operation, an option selection button to select an option of operation, etc.

The plurality of buttons may include a membrane switch, a push switch activated by the pressure of the user, or a touch switch activated by a touch of a body part of the user.

The input 130 may include a remote controller provided separately from the electronic device 1 and a receiver for receiving a radio signal from the remote controller. Similar to the housing, the remote controller may include a plurality of buttons.

In an embodiment, the controller 140 may identify a magnitude of the voltage between the plurality of live terminals 10a and 10c based on the output of the voltage detection circuit 110. Specifically, the controller 140 may determine that the voltage between the plurality of live terminals 10a and 10c is equal to or higher than the threshold when the voltage detection circuit 110 outputs a square wave. Furthermore, the controller 140 may determine that the voltage between the plurality of live terminals 10a and 10c is lower than the threshold when the voltage detection circuit 110 outputs no square wave.

In an embodiment, the controller 140 may determine that the magnitude of the voltage between the plurality of live terminals 10a and 10c is equal to or greater than the threshold when the voltage detection circuit 110 outputs a square wave, and control the electronic device 1 to be operated. For example, the controller 140 may control the first relay 150 and the second relay 160 to be turned on, so that voltages may be applied to the first electric component 30 and the second electric component 40.

In an embodiment, the controller 140 may control the operation of the electronic device 1 to be interrupted when the magnitude of the voltage between the plurality of live terminals 10a and 10c is smaller than the threshold.

Specifically, the controller 140 may determine that the magnitude of the voltage between the plurality of live terminals 10a and 10c is smaller than the threshold when the voltage detection circuit 110 outputs no square wave, and interrupt the operation of the electronic device 1. For example, the controller 140 may control the first relay 150 and the second relay 160 to be turned off not to apply any voltage to the first electric component 30 and the second electric component 40.

In an embodiment, the controller 140 may control the display 170 to display a message indicating that there is an error in supplying power through the power input terminal 10 when the magnitude of the voltage between the plurality of live terminals 10a and 10c is smaller than the threshold.

In an embodiment, the controller 140 may control the speaker 180 to output a sound of notification indicating that there is an error in supplying power through the power input terminal 10 when the magnitude of the voltage between the plurality of live terminals 10a and 10c is smaller than the threshold.

The controller 140 may include at least one memory for storing a program for carrying out the aforementioned and following operations, and at least one processor for executing the program. In a case that the memory and the processor are each provided in the plural, they may be integrated in a single chip or physically distributed.

In an embodiment, the first relay 150 may be arranged between the first live terminal 10a and the second live terminal 10c to be connected in series with the first electric component 30. With this, the first relay 150 may be turned on or off to control supplying a voltage between the first live terminal 10a and the second live terminal 10c to the first electric component 30.

Specifically, when the first relay 150 is turned on, the voltage between the first live terminal 10a and the second live terminal 10c may be applied to the first electric component 30, and when the first relay 150 is turned off, application of the voltage between the first live terminal 10a and the second live terminal 10c to the first electric component 30 may be interrupted.

In an embodiment, the second relay 160 may be arranged between the first live terminal 10a and the neutral terminal 10b to be connected in series with the second electric component 40. With this, the second relay 160 may be turned on or off to control supplying a voltage between the first live terminal 10a and the neutral terminal 10b to the second electric component 40.

Specifically, when the second relay 160 is turned on, the voltage between the second live terminal 10a and the neutral terminal 10b may be applied to the second electric component 40, and when the second relay 160 is turned off, application of the voltage between the first live terminal 10a and the neutral terminal 10b to the second electric component 40 may be interrupted.

In an embodiment, the display 170 may display a message indicating that there is an error in supplying power through the power input terminal 10 when the voltage between the plurality of live terminals 10a and 10c is lower than the threshold, under the control of the controller 140.

For this, the display 170 may include a known type of display panel and may be arranged on the front of the housing.

In an embodiment, the speaker 180 may output a sound of notification indicating that there is an error in supplying power through the power input terminal 10 when the voltage between the plurality of live terminals 10a and 10c is lower than the threshold, under the control of the controller 140.

In this case, the voltage detection circuit 110, the storage 120, the controller 140, the first relay 150 and the second relay 160 may be arranged on a single printed circuit board (PCB) 400 as shown in FIG. 4. In another embodiment, however, the voltage detection circuit 110, the storage 120, the controller 140, the first relay 150 and the second relay 160 may be divided onto a plurality of PCBs, which may be electrically connected to one another.

Furthermore, the voltage detection circuit 110 may be connected to the first live terminal 10a and the second live terminal 10c. Moreover, the first relay 150 may be arranged between the first live terminal (L1 terminal) 10a and the second live terminal (L2 terminal) 10c and connected in series with the first electric component 30. In addition, the second relay 160 may be arranged between the first live terminal (L1 terminal) 10a and the neutral terminal (L2 terminal) 10b and connected in series with the second electric component 40.

Control configuration and circuit configuration of the electronic device 1 have thus far been described. How the voltage detection device 110 detects a voltage between the plurality of live terminals 10a and 10c will now be described in detail.

Figure 5:
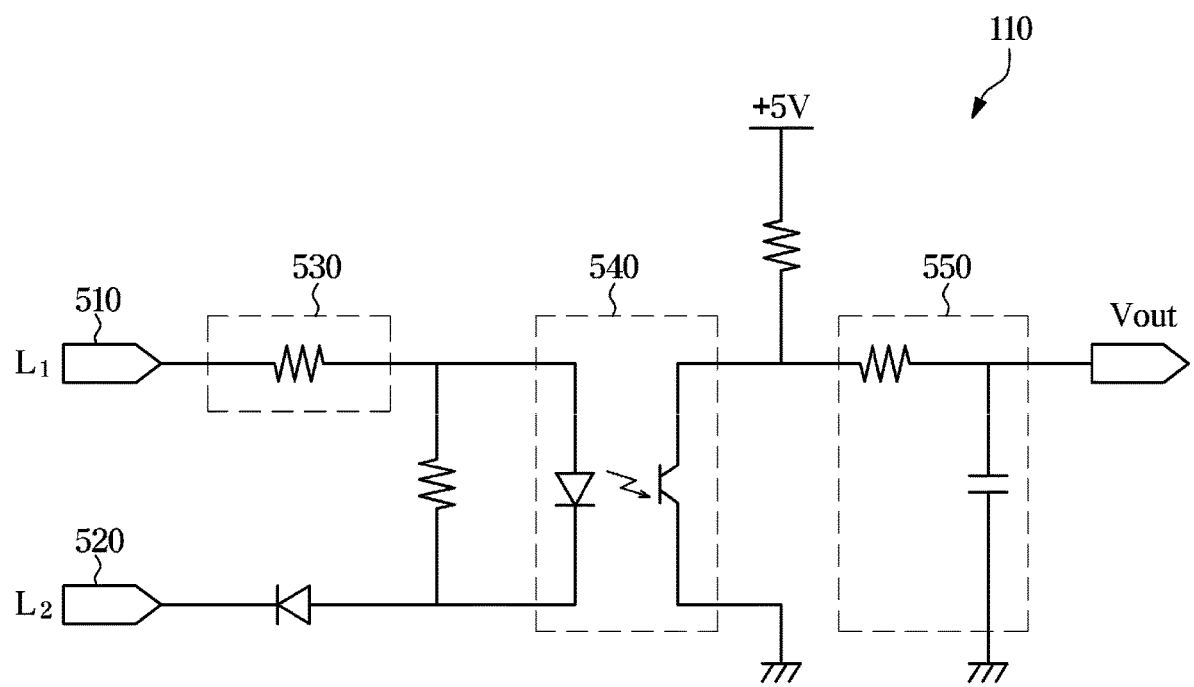
FIG. 5 is a circuit diagram of a voltage detection circuit, according to an embodiment.
Figure 6:
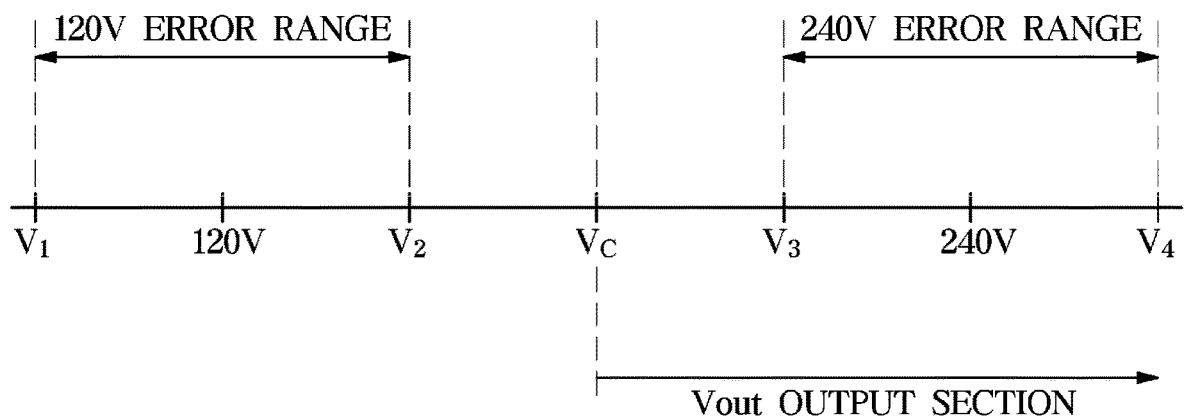
FIG. 6 is a diagram for describing a threshold of a voltage detection circuit, according to an embodiment.
Figure 7:
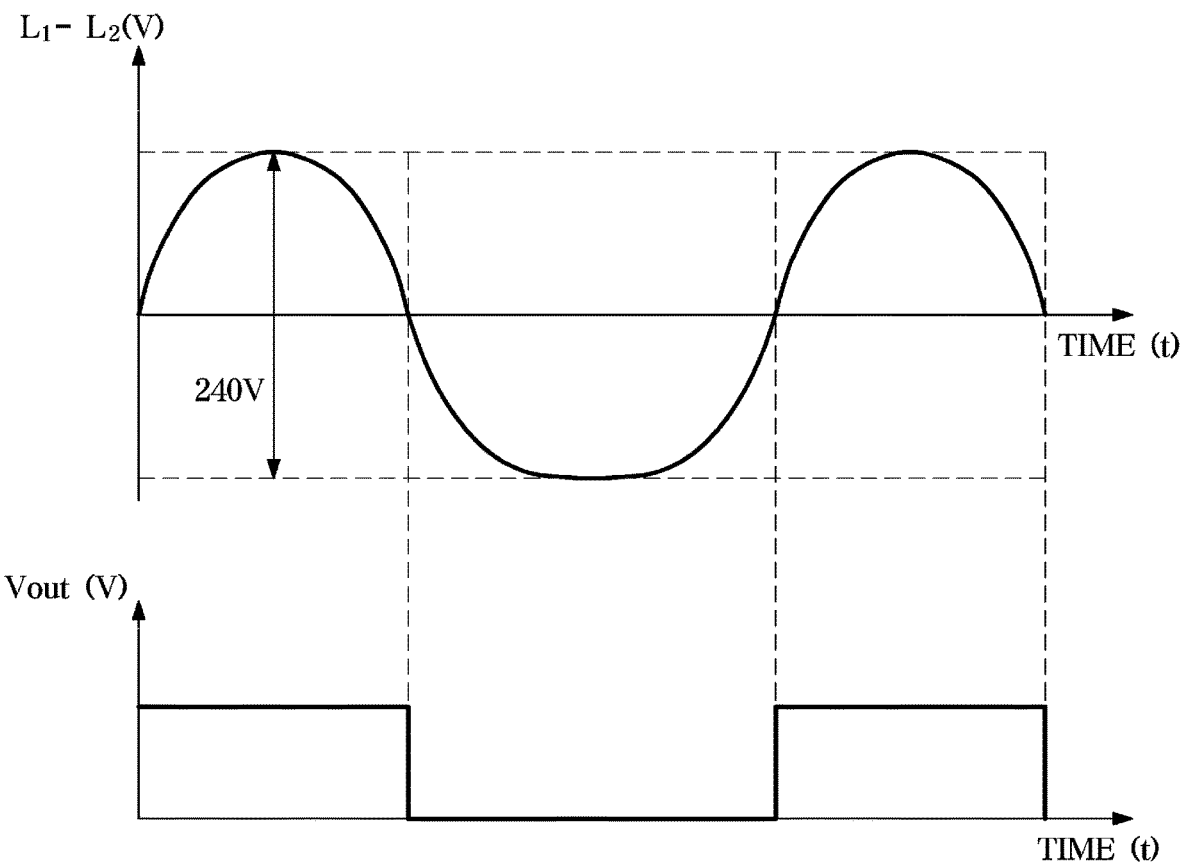
FIGS. 7 and 8 are diagrams for describing outputs of a voltage detection circuit, according to an embodiment.
Figure 8:
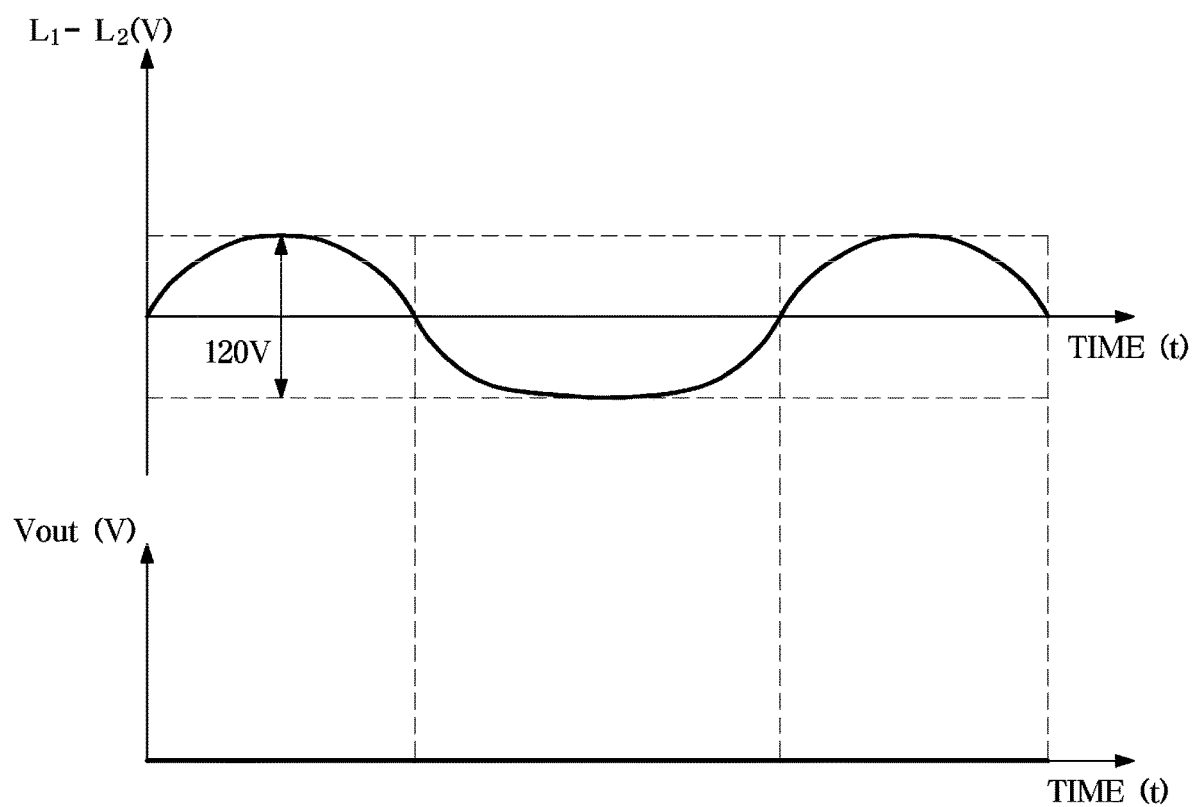

FIG. 5 is a circuit diagram of the voltage detection circuit 110, according to an embodiment, FIG. 6 is a diagram for describing a threshold of the voltage detection circuit 110, according to an embodiment, and FIGS. 7 and 8 are diagrams for describing outputs of the voltage detection circuit 110, according to an embodiment.

Referring to FIG. 5, in an embodiment, the voltage detection circuit 110 may include a first link connector 510 connected to the first live terminal (L1 terminal) 10a and a second link connector 520 connected to the second live terminal (L2 terminal) 10c. With this, the voltage detection circuit 110 may receive a voltage input from the power wire 20 connected to the first live terminal 10a and a voltage input from the power wire 20 connected to the second live terminal 10c.

Furthermore, the voltage detection circuit 110 may include an input resistor 530 to reduce current and voltage values of an electric signal of the input power by a preset value.

Moreover, the voltage detection circuit 110 may include a photo coupler 540, which is an element for transmitting the electric signal of the power in light and may be implemented with a light emitting diode (LED) and a transistor. An insulating material may be included between the LED and the transistor. The photo coupler 540 may output a square wave Vout by half-rectifying the electric signal of the power.

Furthermore, the voltage detection circuit 110 may further include a low pass filter 550 that is able to eliminate high frequency components of the square wave in an embodiment.

The type and number of elements that make up the voltage detection circuit 110 shown in FIG. 5 are merely an example, but are sure to be variously implemented.

As described above, the voltage detection circuit 110 may receive a voltage at the first live terminal (L1 terminal) 10a and a voltage at the second live terminal (L2 terminal) 10c, and the voltage (L1-L2 voltage) between the first live terminal 10a and the second live terminal 10c reduced by the input resistor 530 may be applied to the photo coupler 540.

In this case, only when the voltage between the first live terminal 10a and the second live terminal 10c (L1-L2 voltage) reduced by the input resistor 530 is equal to or higher than a threshold voltage of the LED of the photo coupler 540, light is emitted from the LED of the photo coupler 540, turning on the transistor to output a square wave. Specifically, when the voltage between the first live terminal 10a and the second live terminal 10c (L1-L2 voltage) reduced by the input resistor 530 is lower than the threshold voltage of the LED of the photo coupler 540, light is not emitted from the LED of the photo coupler 540 and no square wave is output.

A resistor value of the input resistor 530 may be set based on the threshold voltage of the LED of the photo coupler 540 so that the voltage detection circuit 110 outputs the square wave only when the voltage between the first live terminal 10a and the second live terminal 10c (L1-L2 voltage) corresponds to a voltage in normal connection.

In other words, the resistor value of the input resistor 530 may be set for the LED of the photo coupler 540 to emit light when the voltage between the first live terminal 10a and the second live terminal 10c (L1-L2 voltage) is equal to or higher than the threshold.

The threshold is to identify an occasion when the first power wire 20a and the second power wire 20c are connected to the first live terminal 10a and the second live terminal 10c, respectively, and voltages are applied to the respective power wires 20a and 20c.

For this, as shown in FIG. 6, the threshold may be determined to be a value Vc between an error range (V1~V2) of the voltage between the first live terminal 10a and the neutral terminal 10b in normal connection of the power wire 20 and an error range (V3~V4) of the voltage between the first live terminal 10a and the second live terminal 10c in normal connection of the power wire 20. In other words, the value Vc between the highest value V2 of the error range (V1 V2) of the voltage between the first live terminal 10a and the neutral terminal 10b in normal connection of the power wire 20 and the lowest value V3 of the error range (V3~V4) of the voltage between the first live terminal 10a and the second live terminal 10c in normal connection of the power wire 20 may be determined as the threshold.

Specifically, the threshold may be determined to be a value (e.g., 180 V) between the error range (e.g., 84 V~156 V) of the voltage (120 V) between the first live terminal 10a and the neutral terminal 10b in normal connection of the power wire 20 and the error range (e.g., 204 V~276 V) of the voltage (240 V) between the first live terminal 10a and the second live terminal 10c in normal connection of the power wire 20.

With this, the power detection circuit 110 may output the square wave Vout by half-rectifying the electric signal of the voltage as shown in FIG. 7 when the first power wire 20a and the second power wire 20c are connected to the first live terminal 10a and the second live terminal 10c, respectively, a voltage is applied to each of the power wires 20a and 20c, and the voltage between the first live terminal 10a and the second live terminal 10c (L1-L2 voltage, e.g., 240V) is equal to or higher than the threshold.

On the other hand, when the second power wire 20c is not connected to the second live terminal 10c and the voltage between the first live terminal 10a and the second live terminal 10c (L1-L2 voltage, e.g., 120V) is lower than the threshold, the power detection circuit 110 may not output the square wave Vout, as shown in FIG. 8.

In an embodiment, the controller 140 may determine that the magnitude of the voltage between the plurality of live terminals 10a and 10c is equal to or greater than the threshold when the voltage detection circuit 110 outputs a square wave, and control the electronic device 1 to be operated. For example, the controller 140 may control the first relay 150 and the second relay 160 to be turned on, so that voltages may be applied to the first electric component 30 and the second electric component 40.

In an embodiment, the controller 140 may control the operation of the electronic device 1 to be interrupted when the magnitude of the voltage between the plurality of live terminals 10a and 10c is smaller than the threshold.

Specifically, the controller 140 may determine that the magnitude of the voltage between the plurality of live terminals 10a and 10c is smaller than the threshold when the voltage detection circuit 110 outputs no square wave, and interrupt the operation of the electronic device 1. For example, the controller 140 may control the first relay 150 and the second relay 160 to be turned off not to apply any voltage to the first electric component 30 and the second electric component 40.

As such, the electronic device 1 controls the electronic device 1 to be operated only when the first power wire 20a and the second power wire 20c are connected to the first live terminal 10a and the second live terminal 10c, respectively, and voltages (of 120 V) having opposite phases are applied to the respective power wires 20a and 20c.

With this, the electronic device 1 may prevent damage by fire and ignition of the electric components 30 and 40 or malfunction of the electric components 30 and 40 that may be caused by wrong connection between the power input terminal 10 and the power wire 20.

Furthermore, when the electronic device 1 is not operated even when being powered on, the user may recognize that there is an error in supplying power through the power input terminal 10.

In this case, when the second power wire 20c is not connected to the second live terminal (no connection) or the second live terminal 10c is connected to the neutral wire 20b instead of the second power wire 20c (wrong connection), the user may connect the second power wire 20c to the second live terminal 10c to supply power through the power input terminal 10.

Furthermore, when the electronic device 1 is not operated even though the second live terminal 10c is connected to the second power wire 20c, the user may recognize that interior wiring in the place where the electronic device 1 is installed has a two-wire type and is thus unable to supply a voltage of 240 V, and may do a wiring work on the interior wiring to apply the voltage of 240 V from an outlet, enabling power to be supplied through the power input terminal 10.

Moreover, when the electronic device 1 is not powered on even with the power button being input, the user may recognize that at least one of the first live terminal 10a and the neutral terminal 10b has an error in wiring, and may connect the first power wire 20a to the first live terminal 10a and the neutral wire 20b to the neutral terminal 10b, enabling power to be supplied through the power input terminal 10.

Figure 9:
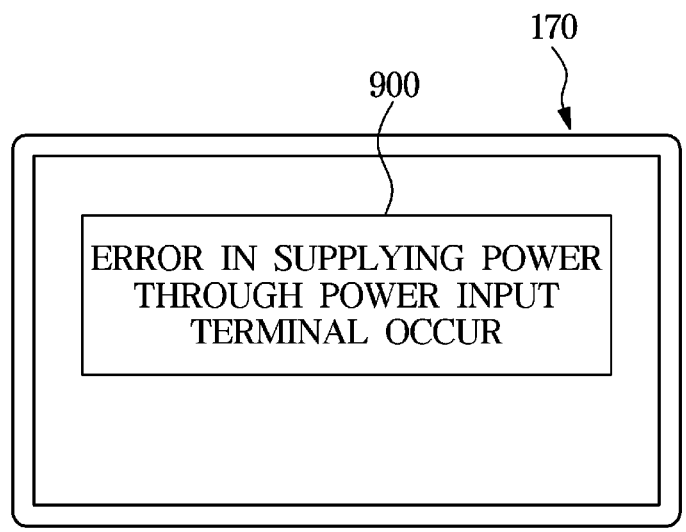
FIG. 9 is a diagram for describing an occasion when an electronic device displays a message, according to an embodiment.

FIG. 9 is a diagram for describing an occasion when the electronic device 1 displays a message, according to an embodiment.

Referring to FIG. 9, in an embodiment, the electronic device 1 may display a message 900 indicating that there is an error in supplying power through the power input terminal 10 when the magnitude of the voltage between the plurality of live terminals 10a and 10c is smaller than the threshold.

Specifically, in an embodiment, when the voltage detection circuit 110 outputs no square wave, the controller 140 may determine that the magnitude of the voltage between the plurality of live terminals 10a and 10c is smaller than the threshold, and interrupt the operation of the electronic device 1 and simultaneously, control the display 170 to display the message 900 indicating that there is an error in supplying power through the power input terminal 10 (e.g., an error occurs in supplying power through the power input terminal).

Furthermore, in an embodiment, when the voltage detection circuit 110 outputs no square wave, the controller 140 may determine that the magnitude of the voltage between the plurality of live terminals 10a and 10c is smaller than the threshold, and interrupt the operation of the electronic device 1 and simultaneously, control the speaker 190 to output a sound of notification indicating that there is an error in supplying power through the power input terminal 10.

In this case, the sound of notification may correspond to voice corresponding to the message of "an error occurs in supplying power through the power input terminal" or correspond to a preset sound.

The user may recognize an occurrence of the error in supplying power through the power input terminal 10 based on at least one of the message 900 or the sound of notification. The user may enable power to be supplied through the power input terminal 10 by normalizing connection between the power input terminal 10 and the power wire 20 or doing a wiring work on the interior wiring to apply a voltage of 240 V from an outlet.

An embodiment of a method of controlling the electronic device 1 will now be described from a perspective. As for the method of controlling the electronic device 1, the electronic device 1 in the aforementioned embodiments may be used. Hence, what are described above with reference to FIGS. 1 to 9 may be equally applied in the following method of controlling the electronic device 1.

Figure 10:
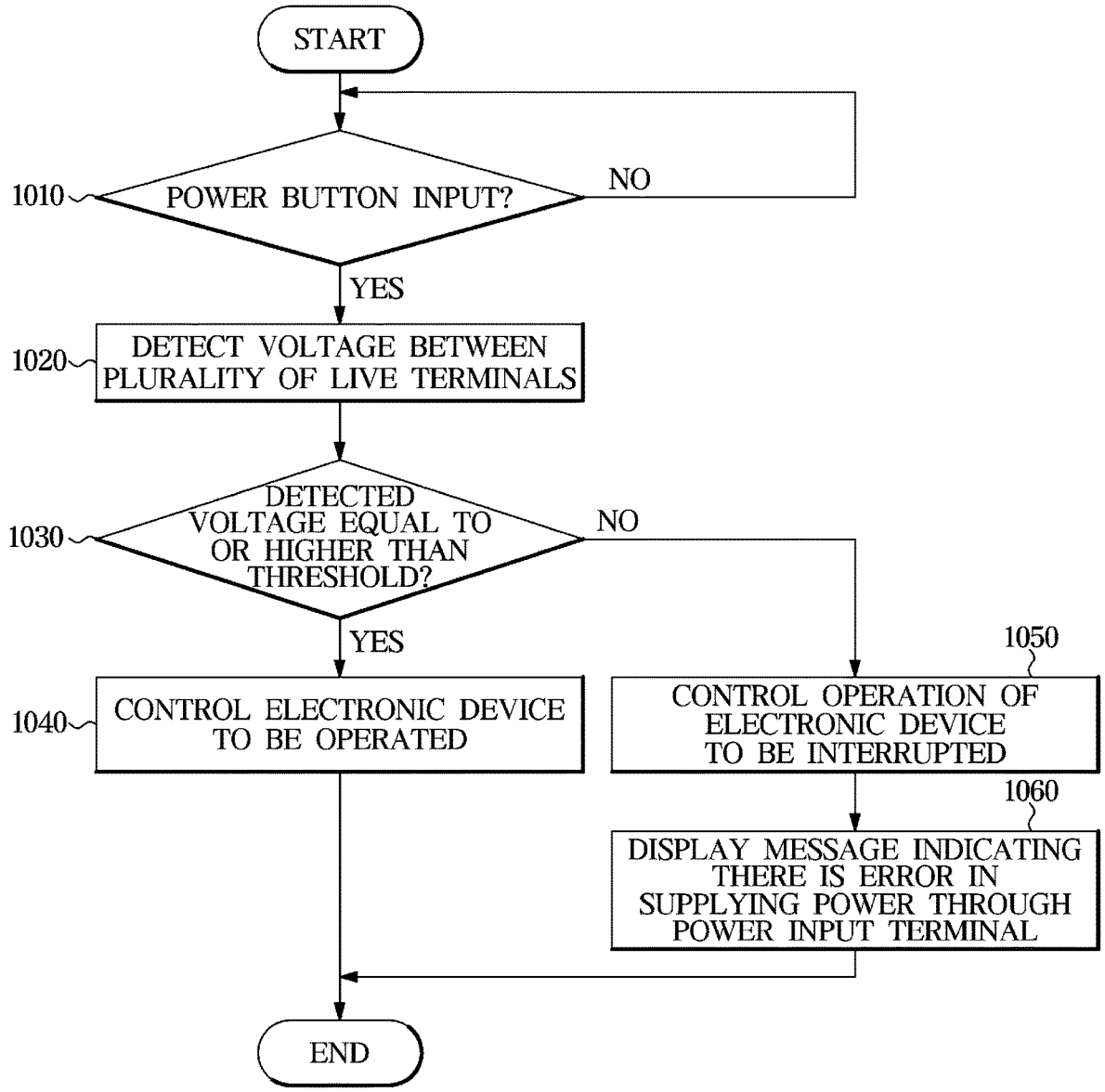
FIG. 10 is a flowchart of a case of detecting an error in supplying power through a power input terminal in a method of controlling an electronic device, according to an embodiment.

FIG. 10 is a flowchart of a case of detecting an error in supplying power through the power input terminal 10 in a method of controlling the electronic device 1, according to an embodiment.

In an embodiment, when the power button is input in 1010, the electronic device 1 may detect a voltage between the plurality of live terminals in 1020.

In this case, the controller 140 may identify a magnitude of the voltage between the plurality of live terminals 10a and 10c based on the output of the voltage detection circuit 110. Specifically, the controller 140 may determine that the voltage between the plurality of live terminals 10a and 10c is equal to or higher than a threshold when the voltage detection circuit 110 outputs a square wave. Furthermore, the controller 140 may determine that the voltage between the plurality of live terminals 10a and 10c is lower than the threshold when the voltage detection circuit 110 outputs no square wave.

In an embodiment, the electronic device 1 may control the electronic device 1 to be operated in 1040, when the detected voltage is higher than the threshold in 1030.

Specifically, the controller 140 may determine that the magnitude of the voltage between the plurality of live terminals 10a and 10c is equal to or greater than the threshold when the voltage detection circuit 110 outputs the square wave, and control the electronic device 1 to be operated. For example, the controller 140 may control the first relay 150 and the second relay 160 to be turned on, so that voltages may be applied to the first electric component 30 and the second electric component 40.

In an embodiment, the electronic device 1 may control the operation of the electronic device 1 to be interrupted in 1050, when the detected voltage is lower than the threshold in 1030.

Specifically, the controller 140 may determine that the magnitude of the voltage between the plurality of live terminals 10a and 10c is smaller than the threshold when the voltage detection circuit 110 outputs no square wave, and interrupt the operation of the electronic device 1. For example, the controller 140 may control the first relay 150 and the second relay 160 to be turned off not to apply any voltage to the first electric component 30 and the second electric component 40.

As such, the electronic device 1 controls the electronic device 1 to be operated only when the first power wire 20a and the second power wire 20c are connected to the first live terminal 10a and the second live terminal 10c, respectively, and voltages (of 120 V) having opposite phases are applied to the respective power wires 20a and 20c.

With this, the electronic device 1 may prevent malfunction of the electric components 30 and 40 such as damage by fire or ignition of the electric components 30 and 40 that may be caused by wrong connection between the power input terminal 10 and the power wire 20.

Furthermore, when the electronic device 1 is not operated even when being powered on, the user may recognize that there is an error in supplying power through the power input terminal 10.

In this case, when the second power wire 20c is not connected to the second live terminal (no connection) or the second live terminal 10c is connected to the neutral wire 20b instead of the second power wire 20c, the user may connect the second power wire 20c to the second live terminal 10c to supply power through the power input terminal 10.

Furthermore, when the electronic device 1 is not operated even though the second live terminal 10c is connected to the second power wire 20c, the user may recognize that interior wiring in the place where the electronic device 1 is installed has two wire type and is thus unable to supply a voltage of 240 V, and may do a wiring work on the interior wiring to apply the voltage of 240 V, enabling power to be supplied through the power input terminal 10.

Moreover, when the electronic device 1 is not powered on even with the power button being input, the user may recognize that at least one of the first live terminal 10a and the neutral terminal 10b has an error in wiring, and may connect the first power wire 20a to the first live terminal 10a and the neutral wire 20b to the neutral terminal 10b, enabling power to be supplied through the power input terminal 10.

In addition, in an embodiment, the electronic device 1 may display a message indicating that there is an error in supplying power through the power input terminal 10, in 1060.

Specifically, in an embodiment, when the voltage detection circuit 110 outputs no square wave, the controller 140 may determine that the magnitude of the voltage between the plurality of live terminals 10a and 10c is smaller than the threshold, and interrupt the operation of the electronic device 1 and simultaneously, control the display 170 to display the message 900 indicating that there is an error in supplying power through the power input terminal 10 (e.g., an error occurs in supplying power through the power input terminal).

Furthermore, in an embodiment, when the voltage detection circuit 110 outputs no square wave, the controller 140 may determine that the magnitude of the voltage between the plurality of live terminals 10a and 10c is smaller than the threshold, and interrupt the operation of the electronic device 1 and simultaneously, control the speaker 190 to output a sound of notification indicating that there is an error in supplying power through the power input terminal 10.

The user may recognize an occurrence of the error in supplying power through the power input terminal 10 based on at least one of the message 900 or the sound of notification. The user may enable power to be supplied through the power input terminal 10 by normalizing connection between the power input terminal 10 and the power wire 20 or doing a wiring work on the interior wiring to apply a voltage of 240 V from an outlet.

Meanwhile, the embodiments of the disclosure may be implemented in the form of a recording medium for storing instructions to be carried out by a computer. The instructions may be stored in the form of program codes, and when executed by a processor, may generate program modules to perform operation in the embodiments of the disclosure. The recording media may correspond to computer-readable recording media.

The computer-readable recording medium includes any type of recording medium having data stored thereon that may be thereafter read by a computer. For example, it may be a read only memory (ROM), a random access memory (RAM), a magnetic tape, a magnetic disk, a flash memory, an optical data storage device, etc.

The embodiments of the disclosure have thus far been described with reference to accompanying drawings. It will be obvious to those of ordinary skill in the art that the disclosure may be practiced in other forms than the embodiments of the disclosure as described above without changing the technical idea or essential features of the disclosure. The above embodiments of the disclosure are only by way of example, and should not be construed in a limited sense.

What is claimed is:

1. An electronic device comprising:
   a power input terminal including a first live terminal, a second live terminal, and a neutral terminal;
   a voltage detection circuit connected between the first live terminal and the second live terminal to detect a voltage between the first live terminal and the second live terminal; and
   a controller configured to control operation of the electronic device to be interrupted in response to a magnitude of the detected voltage being smaller than a threshold,
   wherein the voltage detection circuit is configured to output a square wave by half-rectifying the detected voltage in response to the magnitude of the detected voltage being equal to or greater than the threshold.

2. The electronic device of claim 1, wherein the controller is configured to control the electronic device to be operated in response to the voltage detection circuit outputting the square wave.

3. The electronic device of claim 1, wherein the controller is configured to control operation of the electronic device to be interrupted in response to the voltage detection circuit outputting no square wave.

4. The electronic device of claim 1, further comprising:
   a first electric component connected between the first live terminal and the second live terminal;
   a second electric component connected between the first live terminal and the neutral terminal;
   a first relay connected in series with the first electric component; and
   a second relay connected in series with the second electric component,
   wherein the controller is configured to control the first relay and the second relay to be turned off in response to the magnitude of the detected voltage being smaller than the threshold.

5. The electronic device of claim 1, wherein the threshold is determined as a value between an error range of the voltage between the first live terminal and the second live terminal in normal connection of power wires and an error range of a voltage between the first live terminal and the neutral terminal in normal connection of the power wires.

6. The electronic device of claim 1, further comprising:
a display,
wherein the controller is configured to control the display to display a message indicating that there is an error in supplying power through the power input terminal in response to the magnitude of the detected voltage being smaller than the threshold.

7. The electronic device of claim 1, further comprising:
a speaker wherein the controller is configured to control the speaker to output a sound of notification indicating that there is an error in supplying power through the power input terminal in response to the magnitude of the detected voltage being smaller than the threshold.

8. A method of controlling an electronic device including a power input terminal having a first live terminal, a second live terminal, and a neutral terminal, the method comprising:
detecting a voltage between the first live terminal and the second live terminal by a voltage detecting circuit connected between the first live terminal and the second live terminal;
comparing a magnitude of the detected voltage with a threshold; and
controlling operation of the electronic device to be interrupted in response to the magnitude of the detected voltage being smaller than the threshold,
wherein the voltage detection circuit is configured to output a square wave by half-rectifying the detected voltage in response to the magnitude of the detected voltage being equal to or greater than the threshold.

9. The method of claim 8, further comprising:
controlling the electronic device to be operated in response to the voltage detection circuit outputting the square wave.

10. The method of claim 8, wherein the controlling of the operation of the electronic device to be interrupted comprises controlling the operation of the electronic device to be interrupted in response to the voltage detection circuit outputting no square wave.

11. The method of claim 8, wherein the electronic device includes:
a first electric component connected between the first live terminal and the second live terminal;
a second electric component connected between the first live terminal and the neutral terminal;
a first relay connected in series with the first electric component; and
a second relay connected in series with the second electric component,
wherein the controlling of the operation of the electronic device to be interrupted comprises controlling the first relay and the second relay to be turned off in response to the magnitude of the detected voltage being smaller than the threshold.

12. The method of claim 8, wherein the threshold is determined as a value between an error range of the voltage between the first live terminal and the second live terminal in normal connection of power wires and an error range of a voltage between the first live terminal and the neutral terminal in normal connection of the power wires.

13. The method of claim 8, wherein the electronic device includes a display, and the method further comprising:
controlling the display to display a message indicating that there is an error in supplying power through the power input terminal in response to the magnitude of the detected voltage being smaller than the threshold.

* * * * *